(12) United States Patent
Giattina

(10) Patent No.: US 10,275,544 B1
(45) Date of Patent: Apr. 30, 2019

(54) STANDARD IMPLEMENTATION SYSTEM AND METHOD

(71) Applicant: Chris Giattina, Birmingham, AL (US)

(72) Inventor: Chris Giattina, Birmingham, AL (US)

(73) Assignee: BLOX, LLC, Bessemer, AL (US)

( * ) Notice: Subject to any disclaimer, the term of this patent is extended or adjusted under 35 U.S.C. 154(b) by 348 days.

(21) Appl. No.: 15/248,194

(22) Filed: Aug. 26, 2016

Related U.S. Application Data

(60) Provisional application No. 62/210,684, filed on Aug. 27, 2015.

(51) Int. Cl.
*G06F 17/50* (2006.01)
(52) U.S. Cl.
CPC ................ *G06F 17/5004* (2013.01)
(58) Field of Classification Search
CPC .................................................. G06F 17/5004
See application file for complete search history.

(56) References Cited

U.S. PATENT DOCUMENTS 9,562,632 B1 * 2/2017 Billman et al.
2012/0303149 A1 * 11/2012 Bollendorf

* cited by examiner

*Primary Examiner* — Syed A Roni
(74) *Attorney, Agent, or Firm* — C. Brandon Browning; Maynard, Cooper & Gale, PC

(57) ABSTRACT

A project architectural design plan file represents information about an architectural design plan. The project architectural design plan file is compliant with a standardized program, and within each program, includes a plurality of prefabricated building modules. The requirements for the project are dictated by the program, which is included in the project as a program standards file. The requirements for the prefabricated building modules are set out in module design files. Information about components of the prefabricated building module is embedding in links of the project architectural design plan file.

18 Claims, 8 Drawing Sheets

STANDARD IMPLEMENTATION SYSTEM AND METHOD

RELATED APPLICATION

This application claims priority to U.S. Provisional Application No. 62/210,684, filed on Aug. 27, 2015, and titled "Design Standard Implementation System and Method," the entire contents of which are incorporated herein by reference.

TECHNICAL FIELD

The present disclosure generally pertains to a design standards system and method. The design standards system may used to provide consistent program standards instantly to design, engineering and construction professionals involved with serial production of products.

BACKGROUND OF THE INVENTION

Prototypical designs are a widely employed tool utilized by serial builders, such as car, computer or building manufacturers. These types of manufactures produce hundreds or even thousands of products each year. As a result, production systems are needed to efficiently make the products in a cost efficient manner. In general, prototypes are created at the program level and are applicable to all projects. The prototypes typically present design intent but are interpreted differently by local design teams. The projects may be assigned various architects charged with developing design documents responsive to the program and to design standards. The volume of projects, architects, contractors and site-specific conditions may contribute to variation at every project phase, such as planning, design, documentation and construction. Unnecessary variation increases costs in terms of both time and money.

Serial builders are under constant pressure to reduce design and production costs. The use of building automation controls the above-described design discrepancies and resulting cost inefficiencies with the automatic centralized control of a production system through a management system or automation system. The objectives of production automation are the efficient operation of production systems and a reduction in production costs.

What is needed in the art is a set of design standards which require no interpretation. Specifically, system standards are needed which enable large, dispersed project teams to leverage thousands of hours of work at minimal cost while allowing for the continual improvement of components which may be manufactured off-site.

DETAILED DESCRIPTION OF PREFERRED EMBODIMENTS

As will be apparent to one skilled in the art, various modifications can be made within the scope of the aforesaid description. Such modifications being within the ability of one skilled in the art form a part of the present invention and are embraced by the claims below.

The present disclosure generally pertains to a design standards system and method. In one exemplary embodiment, the design standards system is used to provide consistent program standards instantly to design, engineering and construction professionals involved with serial production of products. In such system, a set of design standards are developed and curated in the program levels so that they may be efficiently applied at the project level. The system utilizes remote servers and software networks that allow centralized data storage and online access to computer services or resources, i.e., "cloud computing".

Figure 1:
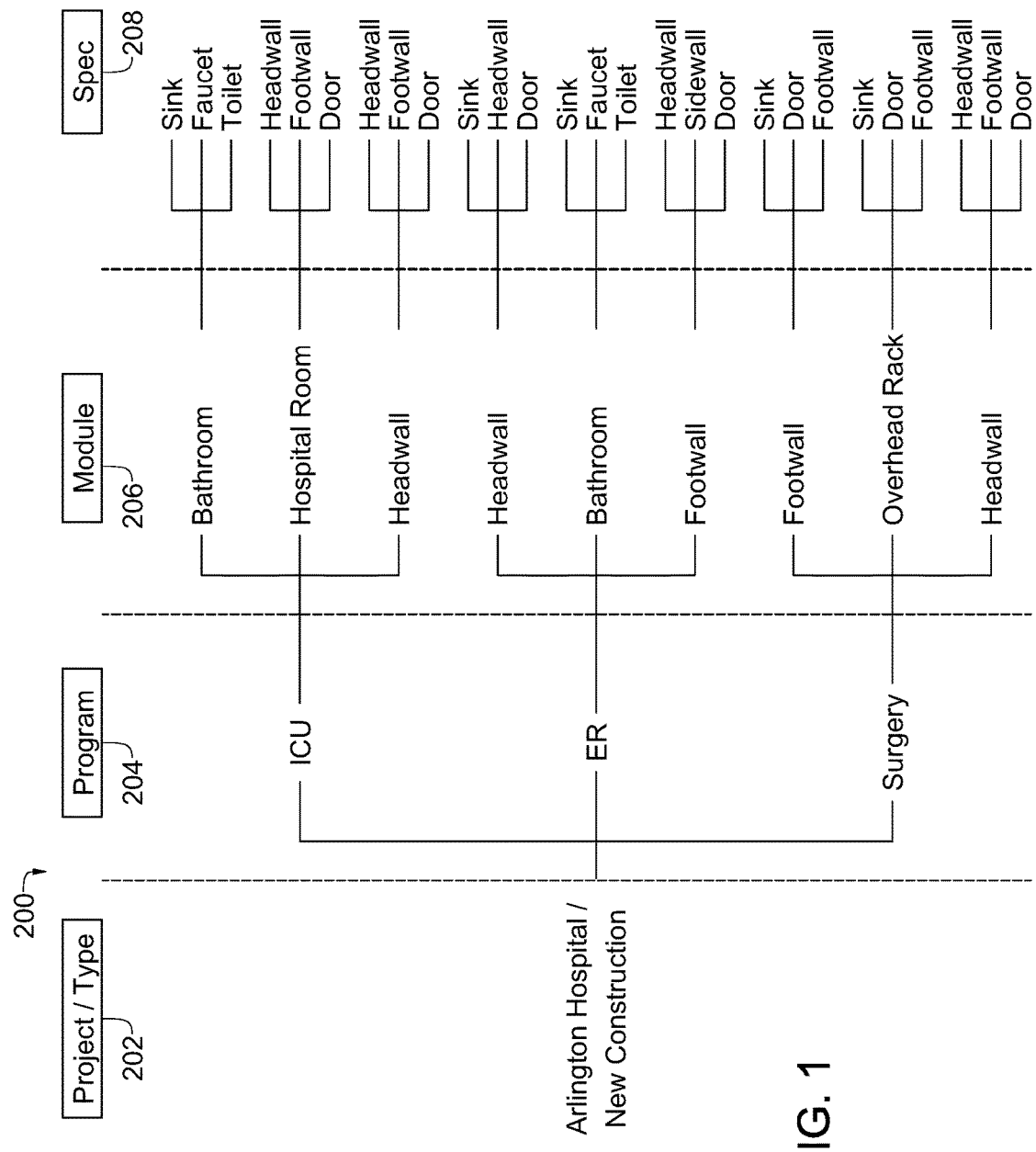
FIG. 1 is a chart illustrating the organization of an exemplary manufacturing project.

FIG. 1 depicts a chart illustrating the organization of an exemplary manufacturing project 200 as used in reference to presently described systems and methods. The project illustrated in FIG. 1 represents the construction of a hospital, although this type of organizational chart is applicable to other types of serial building endeavors which require multiple tasks. Referring again to FIG. 1, the building endeavor is most broadly classified as a project and/or project type 202. The project type may include, for example, the name of the building under construction. In the exemplary embodiment illustrated in FIG. 1, the project is the new construction of a hypothetical Arlington Hospital. In other non-limiting examples, the project type may include a building renovation or repair. Next, the program classification 202 indicates the type of area within the hospital, for instance an intensive care unit (ICU), emergency room (ER) or surgical area. Other types of program areas are applicable in other embodiments. The program classification is further broken down into modules 206. As used herein, a module is a completely prefabricated unit that may be inserted into the building construction. In one non-limiting embodiment, this module may include a bathroom, hospital room, hospital room headwall, hospital room footwall or overhead rack, etc. The final classification includes the specifications or components 208 included in each module 206. In one non-limiting example, the components of a bathroom module may include a sink, a faucet and a toilet. One of skill in the art will understand that other projects 202, components 204, modules 206 and specifications 208 are possible in other embodiments and that those listed in FIG. 1 are merely illustrative.

Figure 2:
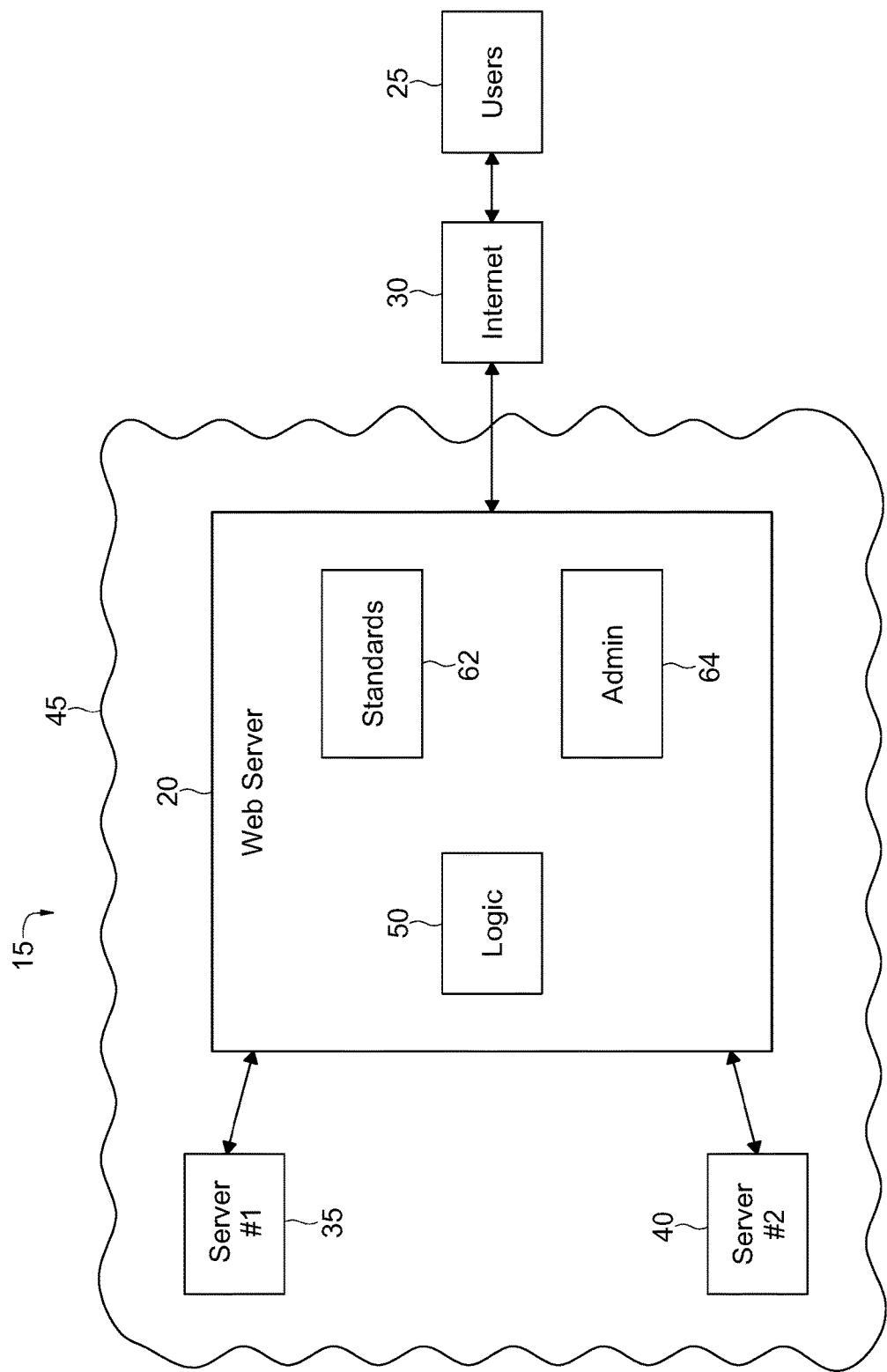
FIG. 2 is a block diagram illustrating an exemplary embodiment of a system for implementing design standards.

FIG. 2 depicts an exemplary embodiment of a system 15 for creating and maintaining design standards for serial manufacturing. In one embodiment, the system 15 may be utilized in the construction business, although other types of manufacturing businesses are possible in other embodiments. As shown by FIG. 2, system 15 comprises a web server 20, which functions to store, process and deliver the system 15 web pages to users 25 via the internet 30. Such users 25 may include, for example, architects, engineers, contractors, builders, parts manufactures and system administrators. System 15 also includes an additional first server 35 and second server 40 for storing design standards and architectural plans and generating output files, as will be described in more detail hereafter. The web server 20, first server 35 and second server 40 operate as remote servers and software networks, allowing centralized data storage and online access to computer services or resources by all users 25. This collection of remote servers and software networks will be referred to herein as "the cloud" or as "cloud computing." In one embodiment, the web server 20, first server 35 and second server 40 may be hosted on a cloud service maintained by a commercial provider. One such provider is Autodesk, Inc. which makes software for the architecture, engineering, construction and manufacturing industries.

Figure 3:
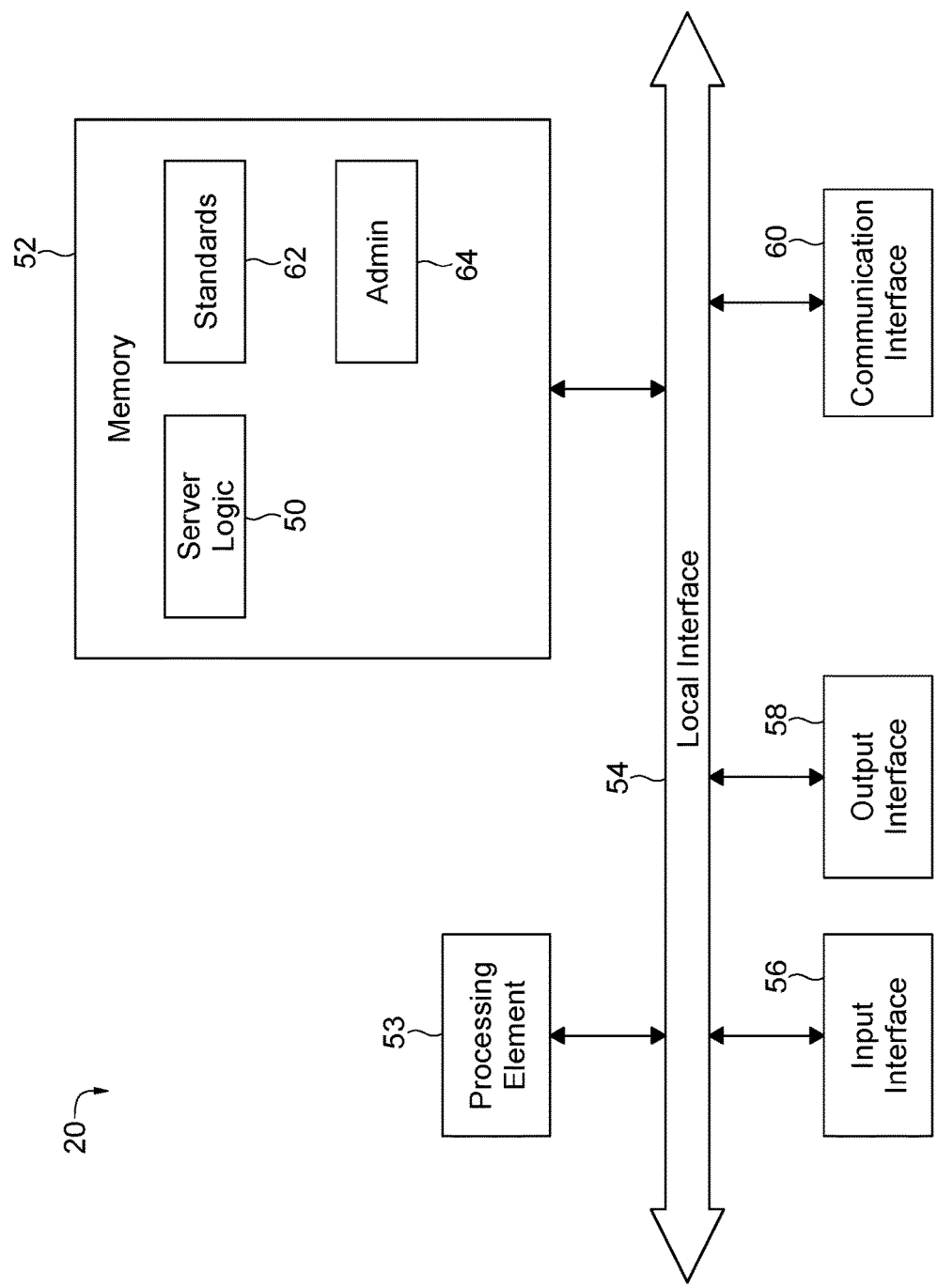
FIG. 3 is a block diagram illustrating an exemplary embodiment of a web server, such as depicted by FIG. 2.

FIG. 3 depicts an exemplary embodiment of the web server 20. Web server 20 provides the vehicle for the users 25 to interact with the system 15. As shown by FIG. 3, the web server 20 comprises logic 50, referred to herein as "server logic," for generally controlling the operation of the web server 20, as will be described in more detail hereafter, including communicating with the first server 35 and the second server 40 and providing an interface for users 25. The server logic 50 can be implemented in software, hardware, firmware or any combination thereof. In the exemplary web server 20 illustrated by FIG. 2, the server logic 50 is implemented in software and stored in memory 52 of the server 20. Note that the server logic 50, when implemented in software, can be stored and transported on any computer-readable medium for use by or in connection with an instruction execution apparatus that can fetch and execute instructions.

The exemplary web server 20 depicted by FIG. 3 comprises at least one conventional processing element 53, which comprises processing hardware for executing instructions stored in memory 52. As an example, the processing element 53 may comprise a central processing unit (CPU) or a digital signal processor (DSP). The processing element 53 communicates to and drives the other elements within the web server 20 via a local interface 54, which can include at least one bus. The processing element 53 also directs communications between the other components of system 15, as will described in more detail hereafter. Furthermore, an input interface 56, for example, a keypad, keyboard or a mouse, can be used to input data from a user of the web server 20, and an output interface 56, for example, a printer, monitor, liquid crystal display (LCD), or other display apparatus, can be used to output data to the user. Further, a communication interface 60 may be used to exchange data with other components of system 15 (FIG. 2).

Referring again to FIG. 3, web server 20 hosts the standards site 62 with which the users 25 interface when utilizing system 15. The standards site 62 contains all of the standards develop for use in system 15, which will be described in more detail hereafter. In an additional embodiment with reference to a construction application, the web server 20 hosts the administrative site 64. In this embodiment, the administrative site 64 allows administers to upload new architectural drawings, controlling projects and revisions, managing new projects, and assigning permissions to users, as will be described in more detail hereafter.

Figure 4:
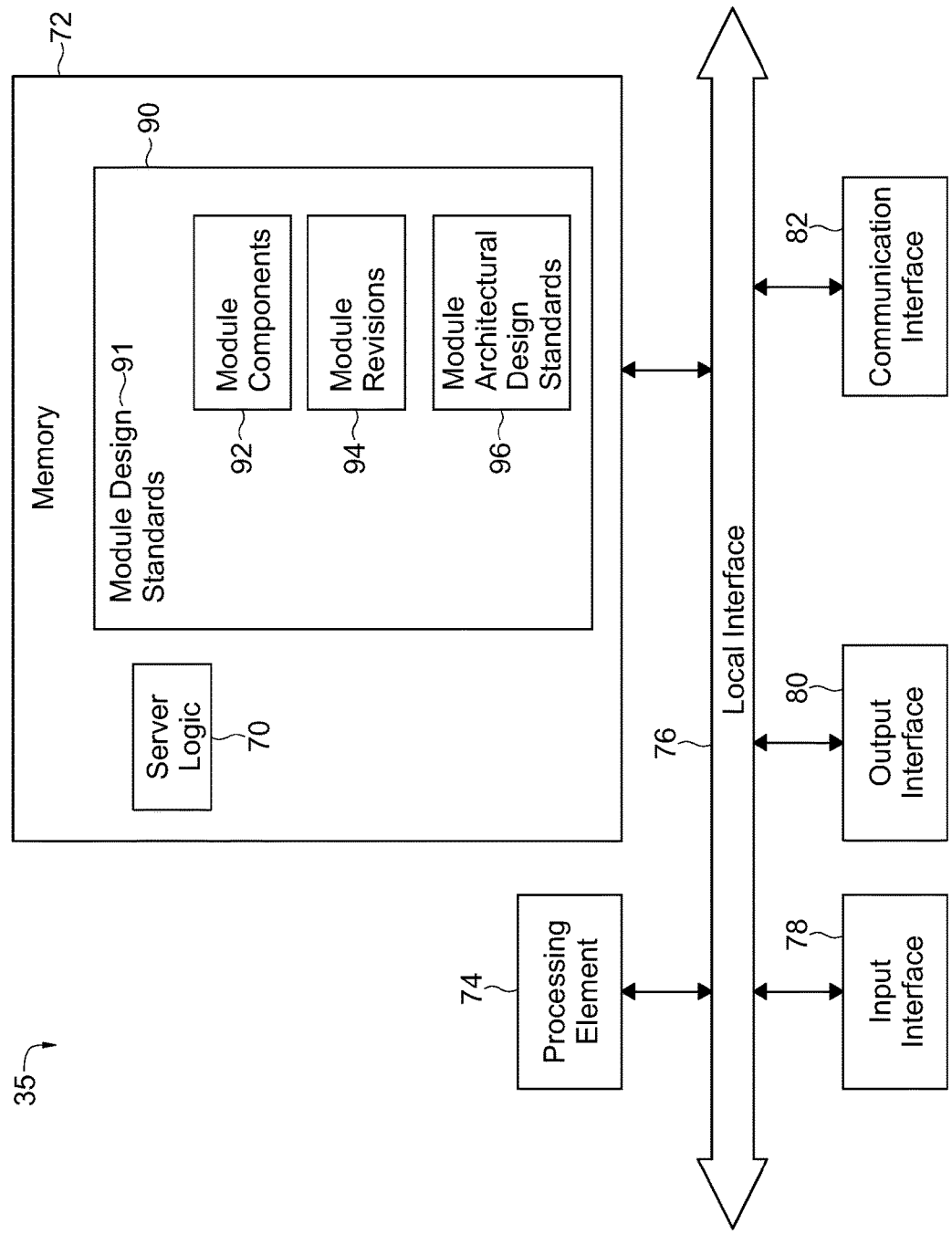
FIG. 4 is a block diagram illustrating an exemplary embodiment of a first database, such as depicted in FIG. 2.

FIG. 4 depicts an exemplary embodiment of a first server 35. The first server 35 is an electronically searchable database, as will be explained in more detail hereafter. As shown by FIG. 4, the first server 35 comprises logic 70, referred to herein as "first server logic," for generally controlling the operation of the first server 35, as will be described in more detail hereafter, including communicating with the web server 20. The logic 70 can be implemented in software, hardware, firmware or any combination thereof. In the exemplary first server 35 illustrated by FIG. 4, the server logic 70 is implemented in software and stored in memory 72 of the first server 35. Note that the server logic 70, when implemented in software, can be stored and transported on any computer-readable medium for use by or in connection with an instruction execution apparatus that can fetch and execute instructions.

The exemplary first server 35 depicted by FIG. 4 comprises at least one conventional processing element 74, which comprises processing hardware for executing instructions stored in memory 72. As an example, the processing element 74 may comprise a central processing unit (CPU) or a digital signal processor (DSP). The processing element 74 communicates to and drives the other elements within the first server 35 via a local interface 76, which can include at least one bus. Furthermore, an input interface 78, for example, a keypad, keyboard or a mouse, can be used to input data from a user of the first server 35, and an output interface 80, for example, a printer, monitor, liquid crystal display (LCD), or other display apparatus, can be used to output data to the user. Further, a communication interface 82 may be used to exchange data with other components of system 15 (FIG. 2).

Referring again to FIG. 4, memory 72 of first server 35 includes a module design standards database 90 for each of a plurality of prefabricated building modules 206. Module design standards for other industries are possible in other embodiments. In this embodiment, each module 206 has a base module design plan that includes a detailed architectural design plan for the module 206 and for every component included within the module. For instance, a module design plan for a bathroom contains a design plan for each mirror, faucet, electrical socket, etc. included in the module 206. Such standards may further include, for example, specifications regarding the size and layout of each module 206 and the components within the module 206. In an additional embodiment, memory 72 further includes a database of module architectural design plans 96 for each of the modules 206 and each component 208 within the modules. In one embodiment, the architectural module file is created and stored in the design plan database 96 by the administrator (FIG. 2). The design plan database 96 is made available to a user 25 through the web server 20, for instance through an internet connection. In one embodiment, the module architectural file is modeled in an .rvt file (i.e., Autodesk Revit). A three dimensional .dwg file (i.e., an AutoCAD file) is exported out of the Revit file and then imported back into a Revit family (.rfa file). Both the Revit family (.rfa) and AutoCAD (.dwg) files are available for download by the user 25 from the web server 20.

Referring again to FIG. 4, the module design standards database 90 further includes a database of the descriptions of the module components 92. These descriptions include, in one embodiment, component manufacturer data, distributor data, cost data, installation data, maintenance data, specification date, parts data and user data. As will be discussed in more detail hereafter, the descriptions of the modular components database 92 may be accessed by all users 25 to ensure uniformity and quality of the components used and consistency in the choice of component manufactures. In an additional embodiment described in more detail hereafter, the information included in the module components database 92 may be used to provide cost and durability analysis.

As illustrated in FIG. 4, memory 72 of the first database 35 further includes a module revision database 94. The organization and function of the modular revision database 94 is further exemplified in FIG. 5. The purpose of this database 94 is to continuously track and update any changes made to the design of the components 208 included in a prefabricated module 206. The design revisions are then made available to all users 25 of system 15 in which the components and modules are used, regardless of the project type 202 or program 204 utilized by the user 25. As a result, any changes to the modular components 208 are uniformly incorporated into any applicable production project. Referring again to FIG. 5, the revision database 94 includes a modular revision status indicator 100. In this embodiment, the current modular revision may be classified as archived 102 (no longer in use), current 104 (in use but not the most current revision) and active 106 (most current). This database organization allows documents associated with older or currently unused modular designs to be available to assist with improvements, as will be described in more detail herein.

Figure 5:
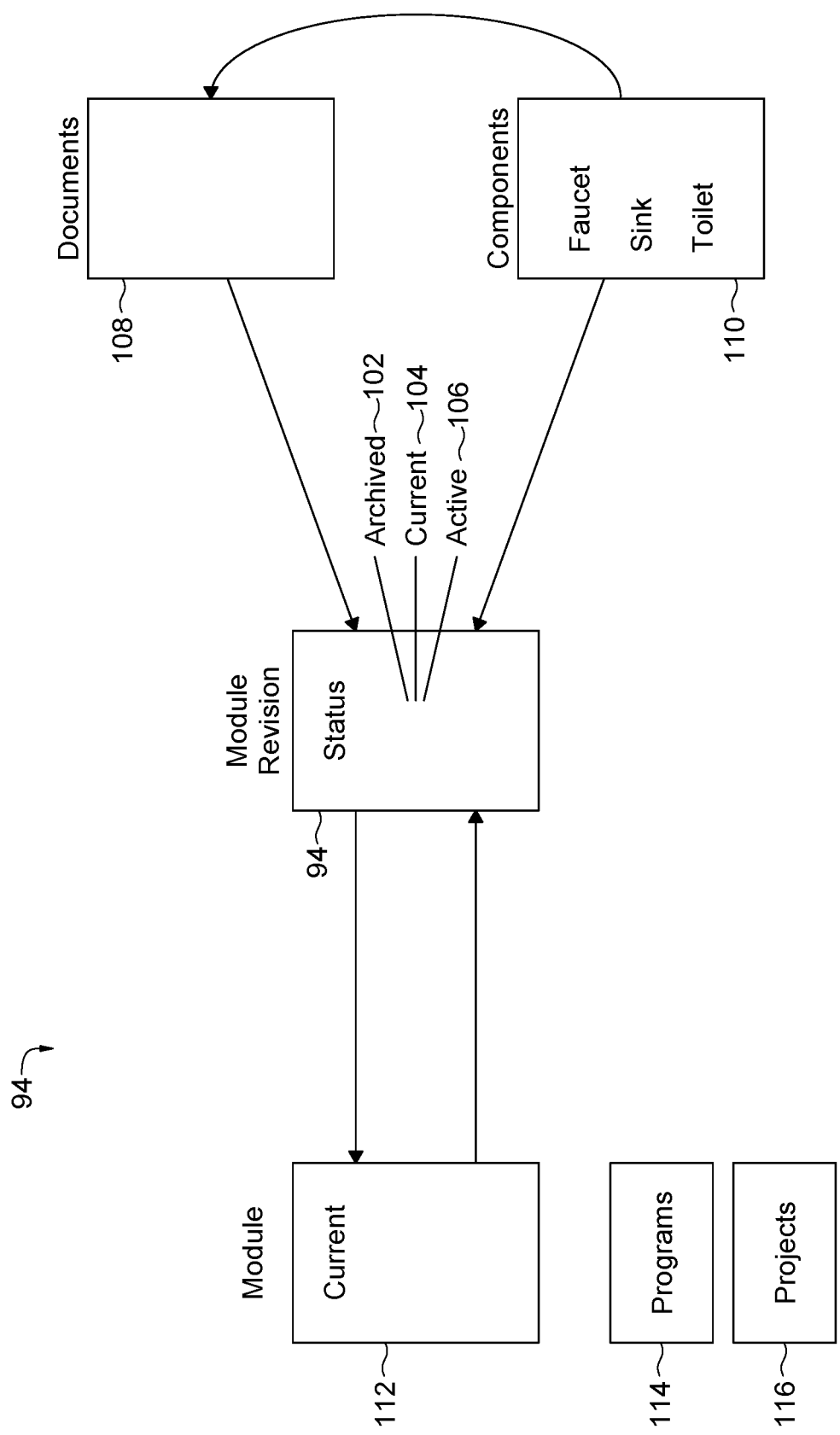
FIG. 5 is a block diagram illustrating an exemplary embodiment of a revisions database.

As illustrated in FIG. 5, each module 206 has a plurality of associated documents 102. Such documents 102 may include, for example, architectural drawings related to the module 206 (FIG. 1) and the components 208 within the module 206. Each of the documents 102 are uploaded by the administrator 64 (FIG. 2) and stored in the documents filed 108 of the modular revisions database 94, for instance as a Revitt file. In an exemplary embodiment, an architectural drawing associated with a faucet is stored in the components database 110. When updates or revisions are made to this file, a new entry is made in the documents 108 portion of the database 94. Additionally, the modular revisions status field 100 is updated to indicate that the current document is current 104.

Figure 6:
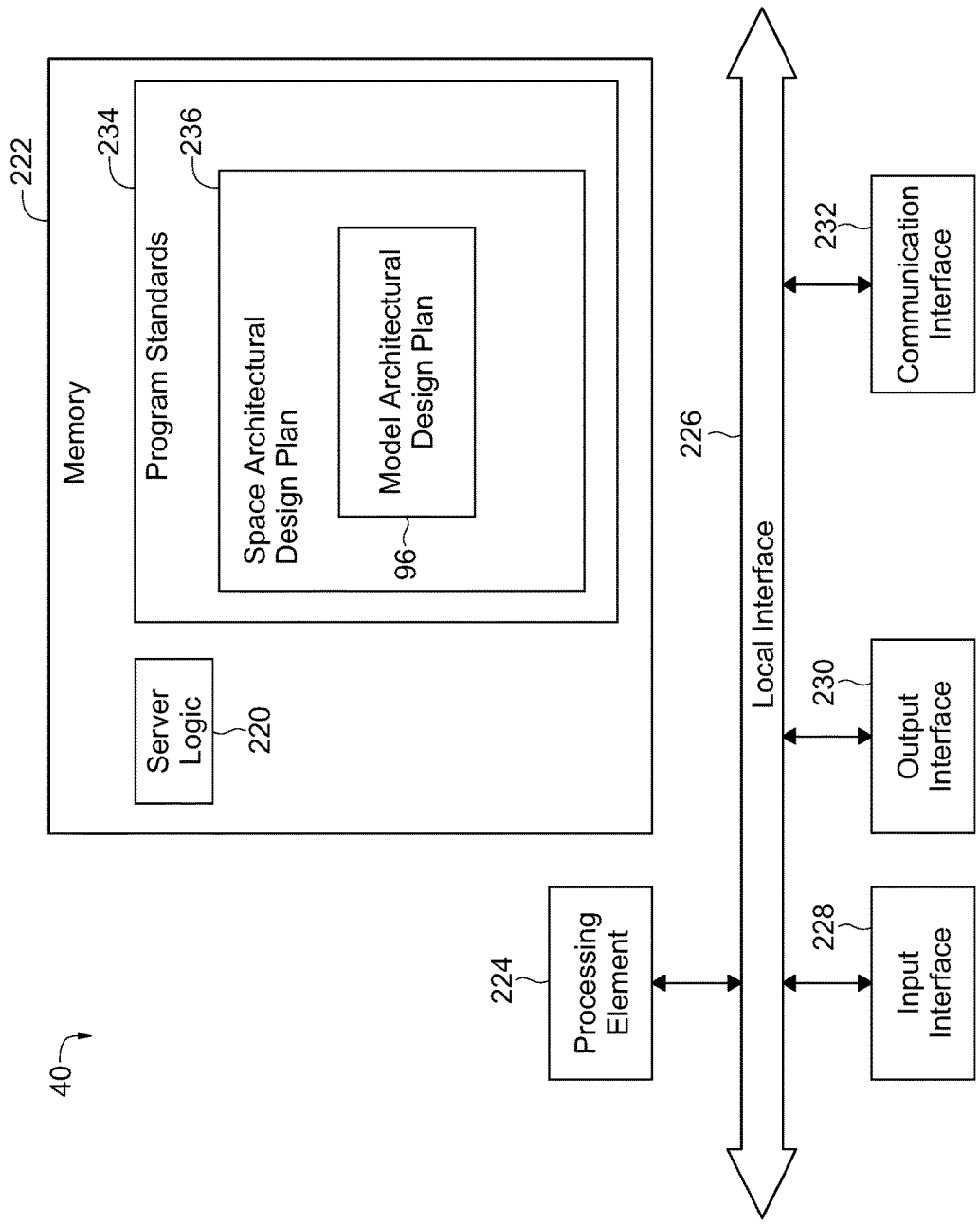
FIG. 6 is a block diagram illustrating an exemplary embodiment of a second database, such as depicted in FIG. 2.

FIG. 6 depicts an exemplary embodiment of a second server 40. The second server 40 is an electronically searchable database, as will be explained in more detail hereafter. As shown by FIG. 6, the second server 40 comprises logic 220, referred to herein as "second server logic," for generally controlling the operation of the second server 40, as will be described in more detail hereafter, including communicating with the web server 20. The logic 220 can be implemented in software, hardware, firmware or any combination thereof. In the exemplary second server 40 illustrated by FIG. 6, the server logic 220 is implemented in software and stored in memory 222 of the second server 40. Note that the server logic 222, when implemented in software, can be stored and transported on any computer-readable medium for use by or in connection with an instruction execution apparatus that can fetch and execute instructions.

The exemplary second server 40 depicted by FIG. 6 comprises at least one conventional processing element 224, which comprises processing hardware for executing instructions stored in memory 222. As an example, the processing element 224 may comprise a central processing unit (CPU) or a digital signal processor (DSP). The processing element 224 communicates to and drives the other elements within the second server 40 via a local interface 226, which can include at least one bus. Furthermore, an input interface 228, for example, a keypad, keyboard or a mouse, can be used to input data from a user of the second server 40, and an output interface 230, for example, a printer, monitor, liquid crystal display (LCD), or other display apparatus, can be used to output data to the user. Further, a communication interface 232 may be used to exchange data with other components of system 15 (FIG. 2).

Referring again to FIG. 6, memory 222 of second server 40 includes a database of program standards 234 for each of a plurality of project spaces into which one or more of the prefabricated building modules 206. Such standards 234 include, for example, space architectural design plans 236 including at least one of the module architectural design plans 96 of the prefabricated building modules 206 stored in the first server 35 (FIG. 4). In this embodiment, each module 206 has a base module design plan that includes a detailed architectural design plan for the module 206 and for every component included within the module. In one embodiment, the standards 234 for each project space are established by the administrator 64 (FIG. 2) and may include design elements for each project as well as governmental standards.

Referring again to FIG. 2, system 15 further includes a computer readable medium 240 (CRM) containing processor readable instructions that, when executed by the processor 54 (FIG. 3), implement certain file creation mechanisms. As used herein, the CRM 240 is a medium capable of storing data in a format readable by a mechanical device. Examples of CRM include, but are not limited to, magnetic media such as magnetic disks, cards, tapes, and drums, optical disks and barcodes and magnetic ink characters.

Figure 7:
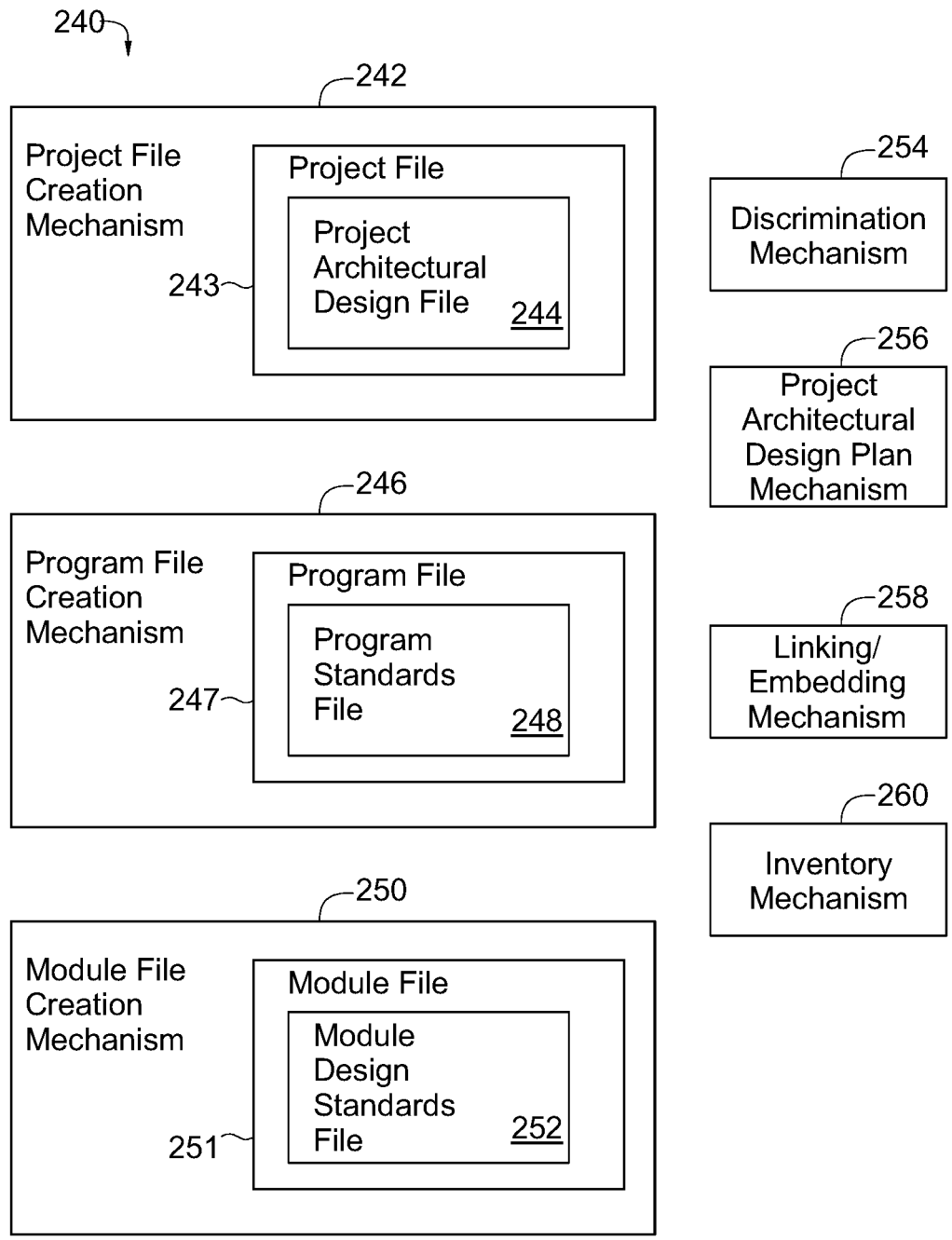
FIG. 7 is a block diagram illustrating an exemplary embodiment of a computer readable medium (CRM).

As illustrated in FIG. 7, the CRM 240 includes a plurality of file creation mechanisms which implement files. In one embodiment, CRM 240 includes a project file creation mechanism 242 which creates a project file 243 upon request by a user 25. In one embodiment, this project file 243 is associated with a project 202 (FIG. 1) and includes a project architectural design file 244. The CRM further includes a program file creation mechanism 246 with a program file 247 including program standards 248 for one or more project specifications 208 included in the project 202 (FIG. 1). Such program standards 248 may include, for example, the width of the halls, the number of windows, etc. that are included with the specific project 202. The program standards 248 are established by the administrator 64. As a result, a user 25 of system 15 may access the program standards 248 and determine the exact specifications for the relevant project 202. The creation and utilization of such program standards 248 ensures uniformity in construction across all programs 204 by such standardization.

Referring again to FIG. 7, the CRN 240 also contains processor readable instructions which, when executed by the processor 54, implements a module creation file mechanism 250 which creates a module file 251. The module file 252 includes module design standards 252 for one or more of the prefabricated building modules 206 that are to be incorporated into the project 202 (FIG. 1). The module design standards 252 may include, for example, the length and width of a bathroom, etc. The module design standards 252 are established by the administrator 64. As a result, a user 25 of system 15 may access the module design standards 252 and determine the exact specifications for the relevant module 206. The creation and utilization of such program standards 248 ensures uniformity in construction across all modules 206, regardless of which project 202 and program 204 such modules 206 are incorporated.

In an additional embodiment, FIG. 7 illustrates that the CRM 240 also contains processor readable instructions which, when executed by the processor 54, implements a discrimination mechanism 254 that determines what program standards 234 from the second database 40 (FIG. 6) and module design standards 90 from the first database 35 (FIG. 4) are included in the program file. Additionally, the CRN also contains processor readable instructions which, when executed by the processor 54, implements a project architectural design plan mechanism 256 for visually displaying a project architectural design plan of the project architectural design file 244 incorporating the module architectural design plans 96 (FIG. 6) of one or more of the prefabricated building modules that are to be incorporated into the construction project. Referring again to FIG. 7, the processor 54 executes processor readable instructions implement a linking or embedding mechanism 258 for linking or embedding the descriptions of components 92 (FIG. 4) of the one or more of the prefabricated building modules 206 (FIG. 1) to the project architectural design file 244. In addition, the processor 54 executes processor readable instructions implement an inventorying mechanism 260 for cataloging the prefabricated building module components 208 (FIG. 1) represented in the project architectural design plan file 244.

Figure 8:
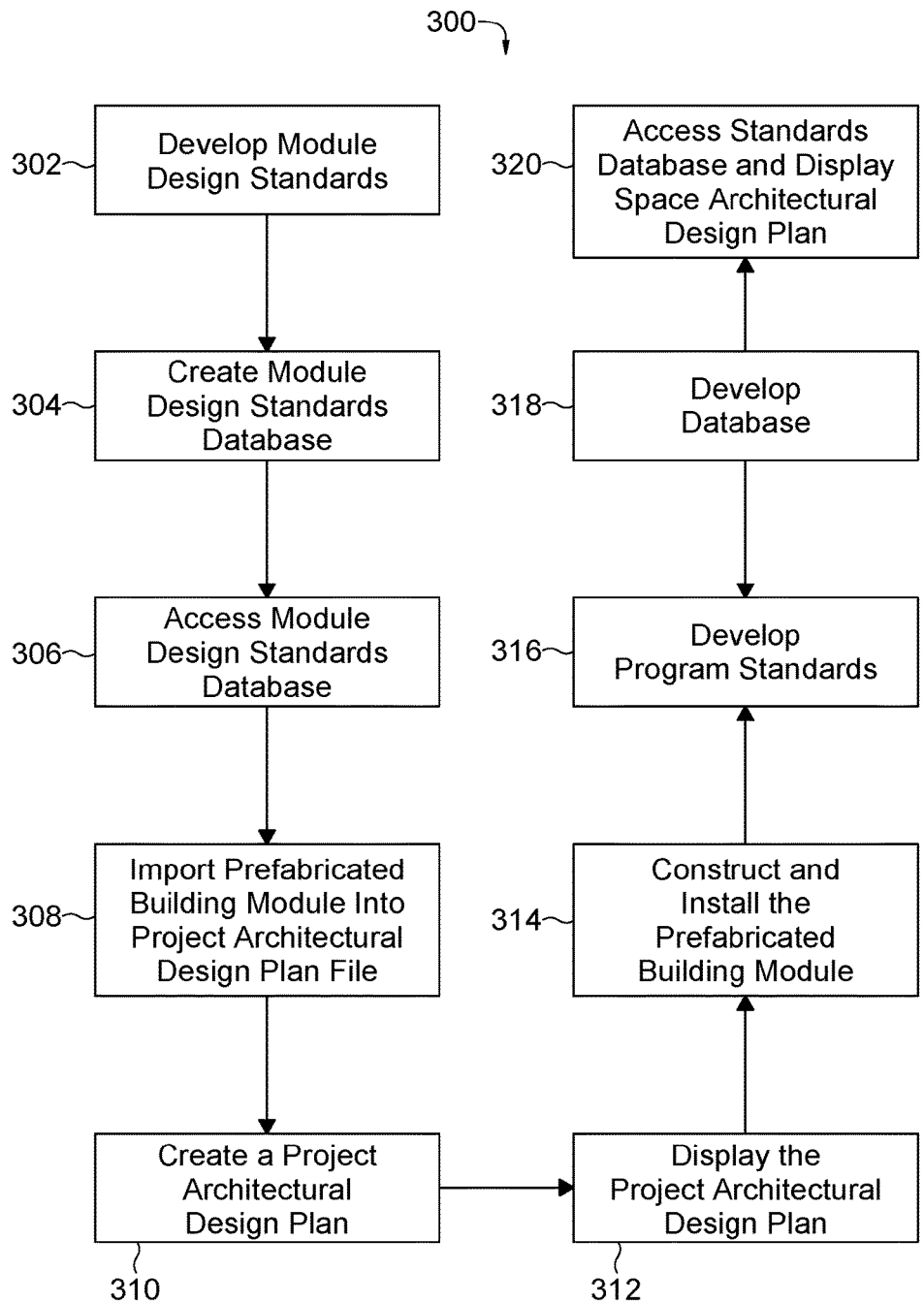
FIG. 8 is a flow diagram illustrating an exemplary embodiment of a design standard implementation system.

FIG. 8 depicts a design standards implementation method 300 in accordance with the present disclosure. In step 302, module design standards 91 (FIG. 4) are developed for a plurality of prefabricated building modules 206 (FIG. 1). The prefabricated building modules may include, for example, bathrooms, hospital room headwalls, hospital room foot walls, overhead racks, and exterior panels. In this embodiment, the module design standards 91 include, for each prefabricated building module of the plurality of prefabricated building modules 206, a module architectural design plan 96 and descriptions of components of the prefabricated building module 92. In one embodiment, he descriptions of components 92 include, but not limited to, component data such as manufacturer data, distributor data, cost data, installation data, facility data, project data, maintenance data, specifications data, parts data and user data. In certain embodiments, the descriptions 92 are linked with the project architectural design plan file 244 through a linking mechanism 258 (FIG. 7). Referring again to FIG. 8, step 304 includes creating a module design standards database 90 by electronically storing the module design standards 91 on a computer system including a processor, a computer readable medium and an interface. In this embodiment, the computer system comprises the first server 35. As described previously, the module architectural design plans 96 and descriptions of components of the prefabricated building module 92 are provided by the administrator 64 and uploaded and stored in the first database 35. Users 25 may access a link to these databases 92 and 96 via the web server 20, for instance through an internet connection. As a result, the large files 92 and 96 are not stored on the web server 20.

As illustrated in FIG. 8, step 306 of the method 300 includes accessing the module design standards database 90 over a network. As described previously, the module architectural design plans 96 and descriptions of components of the prefabricated building module 92 are provided by the administrator 64 and uploaded and stored in the first database 35. Users 25 may access a link to these databases 92 and 96 via the web server 20, for instance through an internet connection. As a result, the large files 92 and 96 are not stored on the web server 20. The user 25 may then export from the module design standards database 90 a prefabricated building module file 251 (FIG. 7) including the module design standards 91 for a first prefabricated building module of the plurality of prefabricated building modules. In step 308, the prefabricated building module file 251 for the first prefabricated building module 206 is imported into a project architectural design plan file 244 (FIG. 7). At step 310, the processor 54 (FIG. 3) creates a project architectural design plan based upon the project architectural design plan file 244 and the prefabricated building module file 251 (FIG. 7). Next, a project architectural design plan 244 is created and displayed, where the project architectural design plan 244 incorporates and illustrates the module architectural design plan 244 of the first prefabricated building module 206 (step 312). Next, as illustrated in step 314, the first prefabricated building module 206 is manufactured and installed according to the project architectural design plan 244 of step 312.

In an additional embodiment, program standards may be developed for each project space 202 into one or more of the prefabricated modules 206 are utilized. In this embodiment, the program standards 234 include a space architectural design plan 236 which incorporates at least one of the module architectural design plans 96 (FIG. 6) (step 316). In step 318, the program standards database 234 is stored in the second server 40 and may accessed by the user through the web server 20, for instance through an internet access. A user 25 may access the program standards database and display the space architectural design plan 236, including at least one module architectural design plan 96 (step 320). The project spaces may include, in one embodiment, hospitals patient rooms, hospital examination rooms, hospital waiting rooms, and hospital post-anesthesia care unit rooms.

In use, a user may utilize system 15 to create a project architectural design plan for a particular construction project. The user 25 logs onto the system 15 through web server 20. Through the administrative portion 64, each user 25 is associated with a particular project 202. Each project 202 is associated with a certain number of programs 204 and modules 206. For instance, in one embodiment, a user 25 will determine that a particular hospital building project will require the construction of an intensive care unit (ICU). The user 25 will then determine that the ICU will contain a certain number of bathroom, hospital room and headwall modules. Each module, through system 15, will be assigned a specific number of components. The module design standards 91 for the module 206 will be extracted and a project architectural design plan 244 is created and displayed for the user 25.

The method 300 described above may be utilized to track inventory, compliance with building module and component standards and tracking maintenance of components. The administrator 64 provides component, module, program and project standards which are used in every project 202 utilizing system 15. The use of uniform components ensures that a component is standardized across every module 206, program 202 and project 202 in which it is incorporated. For example, each bathroom module constructed through the use of system 15 will incorporate the same sink components, i.e., the same pipes, fitting, faucets, etc. As discussed previously with reference to FIG. 5, each module 206 has a plurality of associated documents 102. Such documents 102 may include, for example, architectural drawings related to the module 206 (FIG. 1) and the components 208 within the module 206. Each of the documents 102 are uploaded by the administrator 64 (FIG. 2) and stored in the documents filed 108 of the modular revisions database 94. In an exemplary embodiment, an architectural drawing associated with a faucet is stored in the components database 104. System 15 may generate and visually display these documents. In one embodiment, the web server 20 compile a report of an inventory of the module components 208 used in a particular project 202. This inventory may be created by accessing the project architectural design plan file 244 containing the imported prefabricated building module file 252 (FIG. 7).

It is claimed:

1. A method for generating a compliant and linked architectural design plan file, the method comprising:

accessing, from a module design standards database, one or more module design standards files, wherein each module design standards file is associated with one of a plurality of prefabricated building modules, each module design standards file including, for its associated prefabricated building module, a module architectural design plan and descriptions of components of the prefabricated building module;

accessing, from a program standards database, one or more program standards files, wherein each program standards file is associated with one of a plurality of programs that are available for use in projects, each program standards file defining physical requirements for all projects that comply with the program, and the plurality of the prefabricated building modules that are available for use with the program;

generating a project architectural design plan file, wherein the project architectural design plan file comprises requirements for a particular project and includes a selected program standards file and a selected module standards file, and wherein the requirements for the particular project are in compliance with the program standards file and the selected module standards file; and embedding, within the project architectural design plan file, a plurality of links for the selected module standards files, each link comprising a description of one or more components of a prefabricated building module associated with one of the selected module standards files, and manufacturing a prefabricated building module that is associated with the selected module design standards file.

2. The method according to claim 1, wherein the descriptions of the one or more components include, but are not limited to, component data selected from the group consisting of manufacturer data, distributor data, cost data, installation data, facility data, project data, maintenance data, specifications data, parts data and user data.

3. The method according to claim 2, further comprising, displaying, at a display of a computer system, a project architectural design plan associated with the project architectural design plan file.

4. The method according to claim 1, wherein the plurality of prefabricated building modules are selected from the group comprising bathrooms, hospital room headwalls, hospital room foot walls, overhead racks, and exterior panels.

5. The method according to claim 1 further comprising, displaying, at a display of a computer system, an inventory of prefabricated building module components for the manufactured prefabricated building modules.

6. The method according to claim 1, further comprising:
identifying a damaged or worn-out component of one of the manufactured prefabricated building module;
accessing the project architectural design plan file; and
retrieving from the project architectural design plan file the description of the identified component.

7. The method according to claim 1 wherein each program standards file comprises a space architectural design plan incorporating at least one of the module architectural design plans of the one or more prefabricated building modules.

8. The method according to claim 7, further comprising modifying, within the project architectural design plan file, the selections of the selected module standards files, wherein the modified selection is compliant with the requirements of the selected program standards file.

9. The method according to claim 7, wherein the prefabricated building modules are selected from the group consisting of hospitals patient rooms, hospital examination rooms, hospital waiting rooms, and hospital post-anesthesia care unit rooms.

10. A system to generate a compliant and linked architectural design plan file, comprising:
a processor,
an electronic, searchable first database including module design files for a plurality of prefabricated building modules, the module design files including for each prefabricated building module of the plurality of prefabricated building modules a module architectural design plan and descriptions of components of the prefabricated building module,
an electronic, searchable second database including program standards files for a plurality of programs that are available for use in projects, each program standards file defining physical requirements for all projects that comply with the program, and a plurality of the prefabricated building modules that are available for use with the program; and
a computer readable medium encoded with processor readable instructions that when executed by the processor cause the processor to:
generate a project architectural design plan file, wherein the project architectural design plan file comprises requirements for a particular project and includes a selected program standards file and a selected plurality of module standards files, and wherein the requirements for the particular project are in compliance with the program standards file and the plurality of module standards files; and
embed, within the project architectural design plan file, a plurality of links for the selected module standards files, each link comprising a description of one or more components of a prefabricated building module associated with one of the selected module standards files,
wherein the processor readable instructions further cause the processor to:
identify a damaged or worn-out component of one of a plurality of prefabricated building modules associated with the selected module standards files;
access the project architectural design plan file; and
retrieve from the project architectural design plan file the descriptions of the identified component.

11. The system of claim 10, wherein the descriptions of the one or more components include, but are not limited to, component data selected from the group consisting of manufacturer data, distributor data, cost data, installation data, facility data, project data, maintenance data, specifications data, parts data and user data.

12. The system of to claim 11, further comprising a display in communication with the processor, wherein the processor readable instructions further comprise instructions that cause the processor to generate a project architectural design plan associated with the project architectural design plan file for display at the display.

13. The system of to claim 10, wherein the plurality of prefabricated building modules are selected from the group comprising bathrooms, hospital room headwalls, hospital room foot walls, overhead racks, and exterior panels.

14. The system of to claim 10, wherein the processor readable instructions further comprise instructions that cause the processor to determine an inventory of prefabricated building module components for a plurality of prefabricated building modules associated with the selected module standards files.

15. The system of to claim 14, further comprising a display in communication with the processor, wherein the processor readable instructions further comprise instructions that cause the processor to provide the inventory for display at the display.

16. The system of to claim 10 wherein each program standards file comprises a space architectural design plan incorporating at least one of the module architectural design plans of the one or more prefabricated building modules.

17. The system of to claim 16, wherein the processor readable instructions further comprise instructions that cause the processor to receive a modification, within the project architectural design plan file, of the selections of the selected module standards files, wherein the modified selection is compliant with the requirements of the selected program standards file.

18. The system of to claim 16, wherein the prefabricated building modules are selected from the group consisting of hospitals patient rooms, hospital examination rooms, hospital waiting rooms, and hospital post-anesthesia care unit rooms.

* * * * *